(12) United States Patent
Oppermann et al.

(10) Patent No.: US 12,519,081 B2
(45) Date of Patent: Jan. 6, 2026

(54) METHOD FOR MANUFACTURING A SEMICONDUCTOR ARRANGEMENT

(71) Applicant: Fraunhofer-Gesellschaft zur Förderung der angewandten Forschung e.V., Munich (DE)

(72) Inventors: Hans-Hermann Oppermann, Berlin (DE); Charles-Alix Manier, Berlin (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 645 days.

(21) Appl. No.: 17/809,755

(22) Filed: Jun. 29, 2022

(65) Prior Publication Data
US 2023/0005877 A1    Jan. 5, 2023

(30) Foreign Application Priority Data
Jun. 30, 2021    (DE) ............... 10 2021 206 898.7

(51) Int. Cl.
*H01L 23/00*    (2006.01)
*H01L 25/065*   (2023.01)

(52) U.S. Cl.
CPC ........... *H01L 24/81* (2013.01); *H01L 24/95* (2013.01); *H01L 24/16* (2013.01);
(Continued)

(58) Field of Classification Search
None
See application file for complete search history.

(56) References Cited

U.S. PATENT DOCUMENTS

| | | | |
|---|---|---|---|
| 7,576,414 B2* | 8/2009 | Huang | H01L 24/05 257/630 |
| 12,218,090 B2* | 2/2025 | Li | H01L 21/568 |

FOREIGN PATENT DOCUMENTS

| | | |
|---|---|---|
| DE | 102014201635 B3 | 5/2015 |
| WO | WO-2007113139 A1 | 10/2007 |
| WO | WO-2021122682 A1 | 6/2021 |

OTHER PUBLICATIONS

"German Application Serial No. 10 2021 206 898.7, Office Action dated Jan. 14, 2022", (Jan. 14, 2022), 6 pgs.

* cited by examiner

*Primary Examiner* — Long Pham
(74) *Attorney, Agent, or Firm* — Schwegman Lundberg & Woessner, P.A.

(57) ABSTRACT

Disclosed herein is a method for manufacturing a semiconductor comprising mechanically connecting one or more separate semiconductor components to a common intermediate carrier, arranging the intermediate carrier with respect to a substrate so that, at least for a majority of the semiconductor components, at least one solder pad of a particular semiconductor component lies opposite a solder pad of the substrate associated therewith forming a solder joint, and connecting mutually associated solder pads of the one or more semiconductor components and the substrate by melting and solidifying a solder material arranged between the mutually associated solder pads. A surface tension of the solder material between the mutually associated solder pads of the substrate and the one or more semiconductor components sets a predetermined position of the intermediate carrier relative to the substrate, in which the one or more semiconductor components assume a target position relative to the substrate.

21 Claims, 4 Drawing Sheets

(52) U.S. Cl.
CPC *H01L 25/0655* (2013.01); *H01L 2224/16227* (2013.01); *H01L 2224/81005* (2013.01); *H01L 2224/81138* (2013.01); *H01L 2224/81143* (2013.01); *H01L 2224/81815* (2013.01); *H01L 2224/95001* (2013.01); *H01L 2224/95136* (2013.01); *H01L 2224/95146* (2013.01)

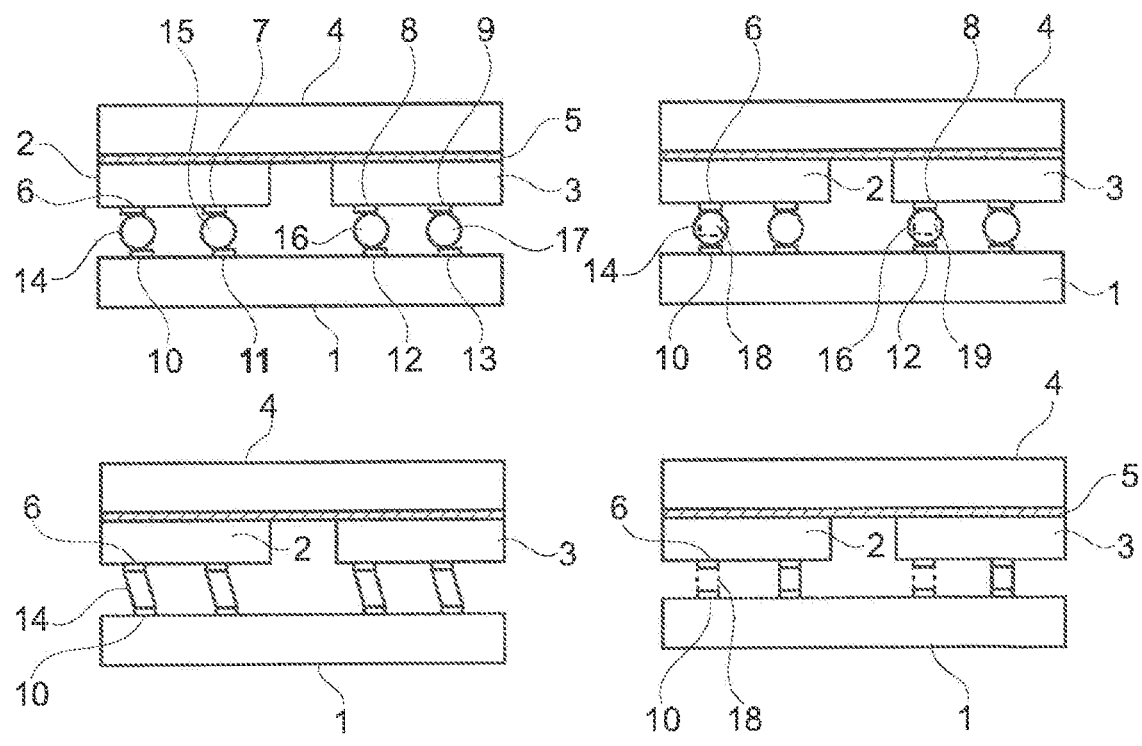
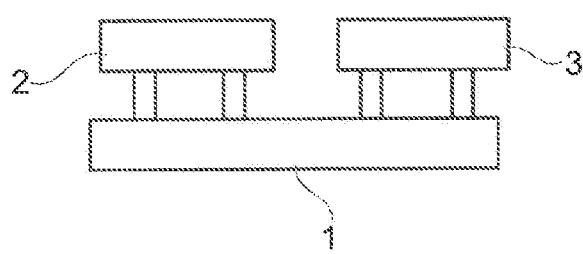
Fig. 1

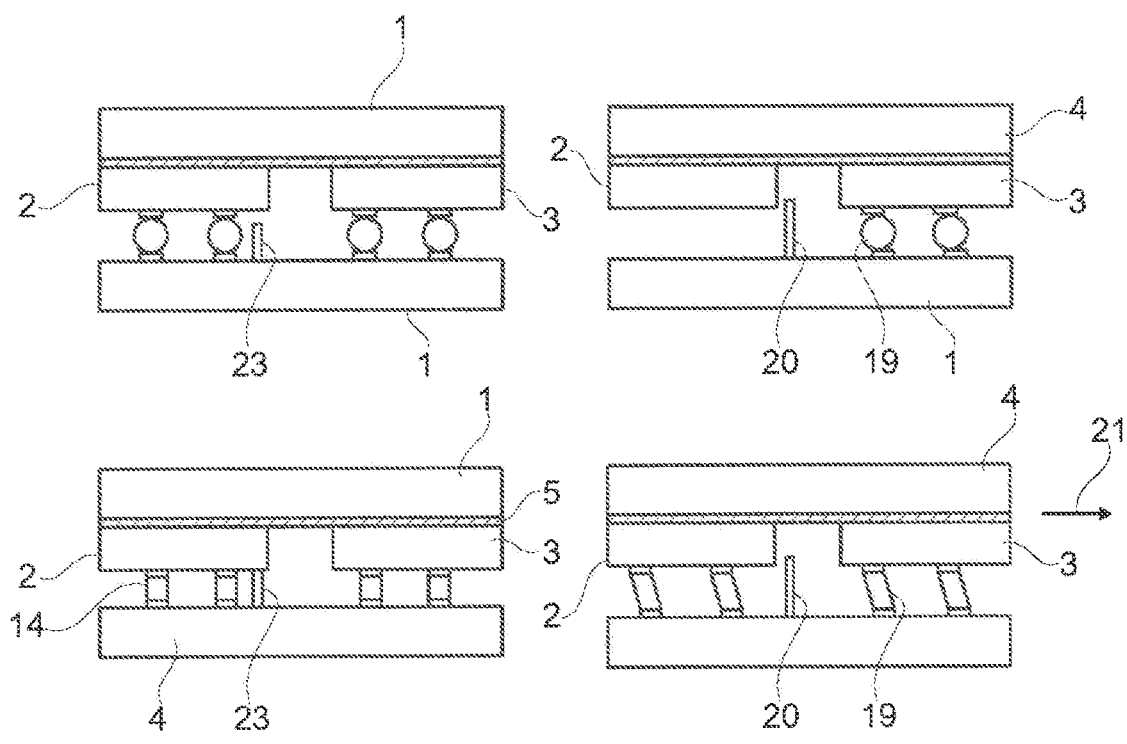
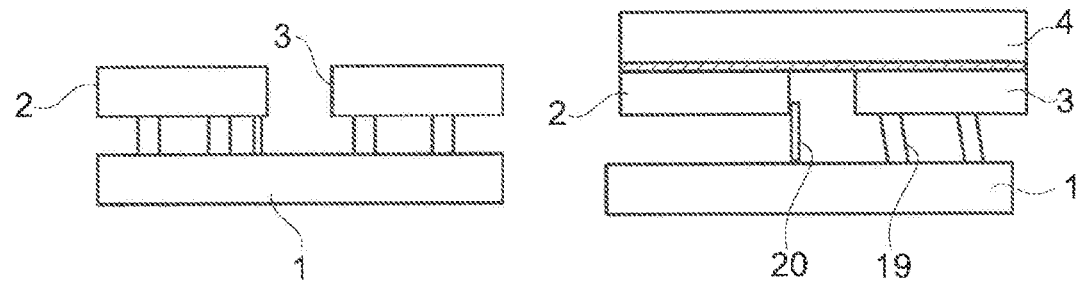
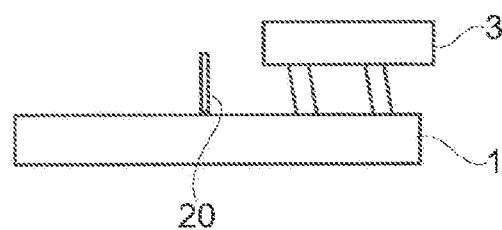
Fig. 5
Fig. 6

METHOD FOR MANUFACTURING A SEMICONDUCTOR ARRANGEMENT

CLAIM FOR PRIORITY

This application claims the benefit of priority of German Application No. 10 2021 206 898.7, filed Jun. 30, 2021, which is hereby incorporated by reference in its entirety.

TECHNICAL FIELD

The present disclosure relates to the field of electrical engineering and more specifically semiconductor technology and can be used with particular advantage in the field of manufacturing complex semiconductor arrangements.

BACKGROUND

For the manufacture of complex semiconductor configurations having a plurality of semiconductor components of the same type or not of the same type, many components are often first manufactured on a semiconductor wafer, then separated and bonded to a substrate, that is, positioned, fixed and contacted depending on the existing requirements.

Meanwhile, the ever-increasing assembly density of semiconductor components places particularly high demands on image recognition and positioning accuracy during automatic positioning and assembly. Particularly when accuracies in the range of one micrometer and less are required, not only does the requirement for the accuracy of the placement machine increase, but more time is also required for the placement of individual elements. In known technologies, the semiconductor components, for example, in the form of chips or chiplets, are individually removed from a sawn wafer and transported, for example, by means of a vacuum tool to precisely align them in position relative to a target substrate and to connect them to the substrate by gluing, soldering, pressure or friction welding or by other methods. The chip size in this case is often very small, for example, having edge lengths of less than 250 µm. The handling of such chips makes special technical demands. The assembly times increase to an unacceptable level, especially when assembling larger units having thousands of chips.

So far, solder-assisted self-adjustment has been known for the precise positioning of individual chips during assembly on a substrate, in which chips are each placed on a substrate, solder pads or wettable pads, which are also referred to as solder pads in this context, being provided on the chip side and on the substrate side, that is, metalized defined contact surfaces bonded together with the interposition of a solder material. During the remelting, that is, the melting and solidification of the solder material, said solder material wets the solder pads and, due to the surface tension, tries to minimize the total surface of the liquid solder material, the solder material exerting adjustment forces on the solder pads, aligning them together with the components symmetrically and precisely. In addition, stoppers and stops can be provided on the chip or substrate side, defining a relative positioning of the parts that are soldered together.

The solder-supported self-adjustment avoids long process times for the fine adjustment and the connection process for the individual chips because the individual chips are each aligned to the substrate in a single, parallel step and soldered thereto. However, there are still long assembly times for the plurality of individual chips on the substrate.

DE 102014201635 B3 discloses a method for equipping a substrate with semiconductor components, in which semiconductor components are first attached to a carrier by means of an adhesive and are transferred from said carrier to a substrate. In this case, the semiconductor components are held on the carrier by means of individual adhesive dots or adhesive patterns, simplifying subsequent separation of the carrier from the semiconductor components.

Against the background of the prior art, the present disclosure is based on the object of connecting a plurality of chips on a substrate with less assembly effort and shorter assembly time while maintaining undiminished reliability and positioning accuracy.

SUMMARY/OVERVIEW

The present disclosure relates to a method for manufacturing a semiconductor arrangement having a substrate and a plurality of semiconductor components individually attached at target positions on the substrate, each of the semiconductor components having one or more solder pads and the substrate having a plurality of solder pads, each being connected to solder pads of the semiconductor components by means of a solder material
having the following steps:
first, a plurality of separate semiconductor components are mechanically firmly connected to a common intermediate carrier,
after that, the intermediate carrier with the semiconductor components attached thereto is then arranged with respect to the substrate so that, at least for a majority of the semiconductor components, at least one solder pad of a semiconductor component lies opposite a solder pad of the substrate associated therewith, the solder pad of the semiconductor component and the solder pad of the substrate associated therewith forming a solder joint,
and after that, mutually associated solder pads of the semiconductor components and the substrate are connected to one another by melting and solidifying the solder material arranged between them, the intermediate carrier being kept freely movable in one or more directions during the phase in which the solder material is liquid, so that the surface tension of the solder material between the respective solder pads of the substrate and the semiconductor components sets a predetermined preferred position of the intermediate carrier relative to the substrate, in which the semiconductor components assume target positions relative to the substrate until the end of the adjustment.

For the sake of simplicity, the term solder pad was used in the same way for both contact sides. The correct description would be that on one side, there is a pad having a metalization that can be soldered plus solder, and on the opposite side, a pad having a metalization that can be soldered and sometimes additionally used with an oxide protection (gold). In principle, the solder can be present on the chips or on the opposite side (target substrate) and the solderable metalization opposite. In principle, however, it is also possible for the solder to be present on both sides. For the sake of simplicity, this is referred to as "solder pads" in general, but this means all of the cases mentioned above.

For this purpose, the solder material should advantageously be simultaneously liquid in one phase at all solder joints used for adjustment by the surface tension of the solder material, so that the intermediate carrier can be moved with respect to the substrate. In extreme cases, this can only be a single solder joint, but in many cases, a plurality of or all solder joints are to be connected. Any remaining solder joints that were not yet connected during the adjustment can be soldered in a further step.

The aim of the method is to arrange a plurality of semiconductor components in a precise position on a substrate and to attach them thereto and, optionally, to make electrical contact therewith. The solder pads in this case can be used to make contact with certain connections of the semiconductor components with the substrate or a conductor or an element on the substrate.

In addition, individual or some or all of the solder pads can be used for generating adjustment forces during the liquid phase when soldering the solder material. Depending on the initial positioning of the intermediate carrier in relation to the substrate, the surface tension of the liquefied solder material at each solder joint pulls the solder pads lying opposite one another towards one another, wherein their distance from one another tends to be reduced and/or if the solder pads are offset laterally, an adjustment force is generated, producing a displacement of the intermediate carrier with respect to the substrate transversely to the direction in which the intermediate carrier approaches the substrate or else parallel to the parting plane formed between the intermediate carrier and the substrate. This solder-assisted self-adjustment process has so far only been used for positioning individual chips or chiplets on a substrate. In the individual positioning and with the common positioning of a plurality of chips with respect to a substrate, attempts have hitherto only been made to optimize the positioning by means of optical adjustment and image analysis. It has been found that even with minor irregularities of individual solder pads in the arrangement of the chips on the intermediate carrier, a resulting adjustment force at a plurality of solder joints is favorable and sufficient for achieving a desired accuracy in the positioning of each individual semiconductor component located on the intermediate carrier. An advantage arising with this method is, for example, that the actual adjustment force can be applied through all or only through individual solder joints that arise on one or more and in particular on fewer than all chips to be positioned. The number of semiconductor components on the intermediate carrier can be greater than 5, in particular greater than 50, more particularly greater than 100, greater than 1000 or greater than 10,000. Corresponding positioning stops or stop elements only need to be provided in small numbers overall, for example, less than 1/10 of the number of semiconductor components, since merely positioning the intermediate carrier itself relative to the substrate with the desired accuracy is sufficient to position each individual semiconductor component. The solder depots can be produced very precisely, for example, by structured galvanic deposition on the solder pads, for example, using a tin-rich (Sn, SnAg) or indium-rich solder or a solder alloy. A particularly suitable high-melting solder alloy can be produced by depositing AuSn solder or gold and tin in two layers, the solder alloy being formed by remelting. Other known solder alloys are also suitable therefor.

The known reflow soldering method can be used as the soldering method, for example, in which initially solder depots in the form of a paste-like solder material or a solder preform (solder balls) are arranged either on the semiconductor components or on the substrate or on both elements and these are then liquefied by the action of heat. For this purpose, a flux can already be contained in the solder paste, it being possible for a gold/tin solder to be used as the solder material. The solder pads are usually formed by metalizations consisting, for example, of a material containing titanium and/or platinum and/or gold, in order to achieve optimized surface tension conditions when the solder material is liquefied. The solder material is applied to the solder pads in a suitable form before melting. The use of solder pastes is conceivable, as is that of solder balls. The use of a micro-galvanic or the vapor deposition of solders can provide higher accuracy at possibly less expense.

In a particular implementation of the method according to the present disclosure, provision can be made, for example, for a plurality of the semiconductor elements to be arranged next to one another on the intermediate carrier in a plane or in a plurality of planes offset parallel to one another, and the planes of the intermediate carrier being aligned parallel to one or more mutually offset planes of the substrate, the intermediate carrier being initially held in one position relative to the substrate during the soldering process, in which an adjustment force is generated at one or more of the solder joints, in particular at fewer than all solder joints, by the surface tension of the solder material, the adjustment force being directed parallel to at least one of the planes. In this case, normally only one type of semiconductor chip is arranged on an intermediate carrier. For a plurality of semiconductor chip types, these are usually bonded to the substrate one after the other with an intermediate carrier, the previous semiconductors being thinner than those subsequent in order to prevent the intermediate carrier from colliding with the chips that have already been bonded.

With such a design of the method, it can then be provided that the positioning of the intermediate carrier during the soldering process causes the intermediate carrier to be displaced parallel to the plane or planes of the intermediate carrier by adjustment forces generated by surface tension of the solder material, such that at least one lateral stop element of one of the semiconductor components comes into contact with a lateral stop element of the substrate.

For example, a single stop element or a single stop surface or edge on one element per degree of freedom can then be sufficient for the relative positioning of the intermediate carrier and the substrate. This means that there is at least one stop element in each case in two directions within the plane of the substrate or of the intermediate carrier, it also being possible for a plurality of stop elements to be provided. However, it proves to be advantageous if the number of stop elements is significantly less than the number of semiconductor components to be positioned. In addition, it can be provided that during the soldering process, the intermediate carrier is brought close enough to the substrate so that one or two or more than two vertical stop elements of one or more semiconductor elements, the vertical stop element(s) limiting a relative movement perpendicularly to the plane or planes of the intermediate carrier, comes or come into contact with one or more common vertical stop elements of the substrate.

An edge or side face of a semiconductor component can also be regarded as a stop element. A vertical stop element on the intermediate carrier side can, for example, also stop on the surface of the substrate itself.

The distance between the semiconductor components and the substrate is thus also set to the desired accuracy while the semiconductor components are still connected to the intermediate carrier. For example, three vertical stop elements or three pairs of stop elements, of which one is arranged on the substrate and one on a semiconductor component, can be sufficient for the final and precise positioning of the entire intermediate carrier relative to the substrate. All individual semiconductor components are then also positioned as desired relative to the substrate with respect to the direction perpendicular to the plane of the intermediate carrier or substrate. Webs or rods, which are each arranged on the substrate or on semiconductor components, can serve as stop elements, and on the respective other side, said webs or rods or other stop elements can each come into contact on said opposite further stop elements, which, for example, can also be formed by the plane/surface of the substrate or, on the side of the intermediate carrier, the planes/surfaces of the semiconductor components themselves. Such stop elements can be glued or otherwise attached there to the semiconductor devices or the substrate, or they can be manufactured integral with said elements, for example, by epitaxy, lithographic masking and etching or other methods. Additive manufacturing processes such as 3D printing can also be used to apply such stop elements.

As part of the manufacturing method, it can further be provided that after the soldering process, the intermediate carrier is separated from some or all of the semiconductor components by the application of force with or without acting on an adhesive connecting the semiconductor components to the intermediate carrier. The adhesive can be acted on, for example, by laser ablation.

It can further be provided in the method that after the soldering process, the intermediate carrier is separated from some semiconductor components by the application of force with or without acting on an adhesive connecting the semiconductor components to the intermediate carrier and that the intermediate carrier together with one or more semiconductor components, which form or contain mechanical stops for the previous positioning of the intermediate carrier relative to the substrate, is removed from the substrate.

Since the individual semiconductor components are preferably attached to the intermediate carrier by means of an adhesive, on the one hand, the adhesive can be selected such that the intermediate carrier can be lifted off the semiconductor component or components against the adhesive force, the semiconductor components adhering more firmly to the substrate by means of the solder joints than to the intermediate carrier. For this purpose, provision can be made, for example, for the individual semiconductor components to be attached to the intermediate carrier only by means of individual, relatively small adhesive spots or adhesive areas, and/or it can also be provided for the adhesive connections to be weakened, for example, by making the adhesive brittle by means of the effect of electromagnetic radiation or other controllable external influences such as temperature influences or the like.

In this case, the fixation of the individual semiconductor components on the intermediate carrier can also be selectively different in strength, so that individual semiconductor components are lifted off the substrate with the intermediate carrier, while other semiconductor components remain adhering to the substrate. For example, it can be provided that such semiconductor components that adhere to the intermediate carrier and are lifted off the substrate are used exclusively for the formation or provision of mechanical stops in order to position the semiconductor components and the intermediate carrier relative to the substrate during the soldering process.

The semiconductor components can also be separated from the intermediate carrier by irradiation with UV light through the then transparent intermediate carrier. The UV exposure causes the adhesive to lose its adhesive effect and the intermediate carrier can be separated from the semiconductor chips.

A laser, for example, a UV laser, can be used for reducing the adhesive force. Here, the transparent intermediate carrier is scanned from the rear side using the UV laser, the adhesive layer separating from the intermediate carrier.

In a further configuration, it can be provided, for example, that the semiconductor components are first manufactured on a common starting wafer, that the starting wafer is then connected to a handling wafer such that each of the semiconductor components is held on the handling wafer, that the semiconductor components are then separated from one another by a method known per se and that the handling wafer is then used as an intermediate carrier.

In this case, the semiconductor components formed there are initially positioned very precisely and reliably relative to one another on the wafer as a result of the manufacturing process. The connection of the starting wafer to the handling wafer does not change anything here, and as a result the individual semiconductor components on the handling wafer are positioned just as precisely relative to one another. This state is retained even after the individual semiconductor components have been separated from one another by means of sawing, etching or other methods. If the handling wafer is then used as an intermediate carrier, all of the semiconductor components attached to the intermediate carrier can be positioned relative to the substrate by positioning a single semiconductor component or a few selected semiconductor components relative to a substrate. And if the semiconductor components are individually firmly connected to the substrate by one or more soldered connections, then the semiconductor components can be attached to the desired target positions on the substrate by a single adjustment process of the intermediate carrier relative to the substrate.

The manufacturing method described above can be further developed in that the semiconductor components, while they are each connected to the handling wafer on one of their sides, are connected to a further handling wafer on their other opposite side, that the connections to the handling wafer are then severed and that the further handling wafer then acts as an intermediate carrier.

The inclusion of an additional handling wafer after the semiconductor devices are attached on a first handling wafer allows the semiconductor devices to be accessed from the side initially connected to the first handling wafer. This side of the semiconductor devices can then be connected to the substrate.

In this case, the adhesive points of the further handling wafer can be structured such that only a selection of semiconductor components is temporarily fixed to the further handling wafer. If this selection of semiconductor components is separated from the first handling wafer, only this selection can be bonded to the substrate.

Due to the optional rebonding of the semiconductor components onto a further handling wafer, it is thus possible, within the scope of the method according to the present disclosure, to attach the semiconductor components to a substrate both with their front side and with their rear side.

In addition to the above-mentioned method and its configuration options, the present disclosure also relates to an arrangement having an intermediate carrier to which a plurality of semiconductor components are firmly connected and having a substrate, both the semiconductor components and the substrate having solder pads connected to one another by a solder material and mechanical stop elements relatively positioning the intermediate carrier with the semiconductor components relative to the substrate and the positioning of the solder pads on the semiconductor components and the substrate and the positioning of the stop elements being selected such that when the solder material arranged between opposite solder pads liquefies, adjustment forces are generated at at least one solder joint due to its surface tension, the adjustment forces holding the stop elements of the semiconductor devices and the substrate against each other.

It can be provided here that at least one individual solder joint is designed such that said solder joint generates adjustment forces through the surface tension of the solder material, while other solder joints, for example, almost all other or actually all other solder joints, are designed such that they do not result in any adjustment forces, at least in the transverse direction, that is, in the plane of the substrate and/or the intermediate carrier. This is the case when the solder pads of each of the solder joints, with the exception of the individual solder joint, are directly opposite one another and without any lateral offset. For those solder joints that generate adjustment forces, the solder pads of the individual solder joint are laterally displaced from one another, so that the solder material in liquefied form assumes the shape of a sheared-off truncated cone. It is to be expected that practically all solder joints will generate forces when the solder material is liquefied, bringing the two solder pads closer together, so that in most cases, it will make sense to also provide vertical stop elements to define the distance between the individual semiconductor components and the substrate.

BRIEF DESCRIPTION OF THE FIGURES

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 1 illustrates four stages of the horizontal alignment of chips with respect to a substrate by collective reflow soldering.

FIG. 2 illustrates three stages of the vertical alignment of chips with respect to a substrate during reflow soldering with vertical stops in the solder bumps.

FIG. 5 illustrates three stages in the alignment of chips with respect to a substrate in the vertical direction with separate stop elements attached to the substrate.

FIG. 6 illustrates four stages in the alignment of chips with respect to a substrate with separate stop elements on the substrate, individual chips on the intermediate carrier having no solder joints and being removed after alignment.

DETAILED DESCRIPTION

Figures 3, 4:
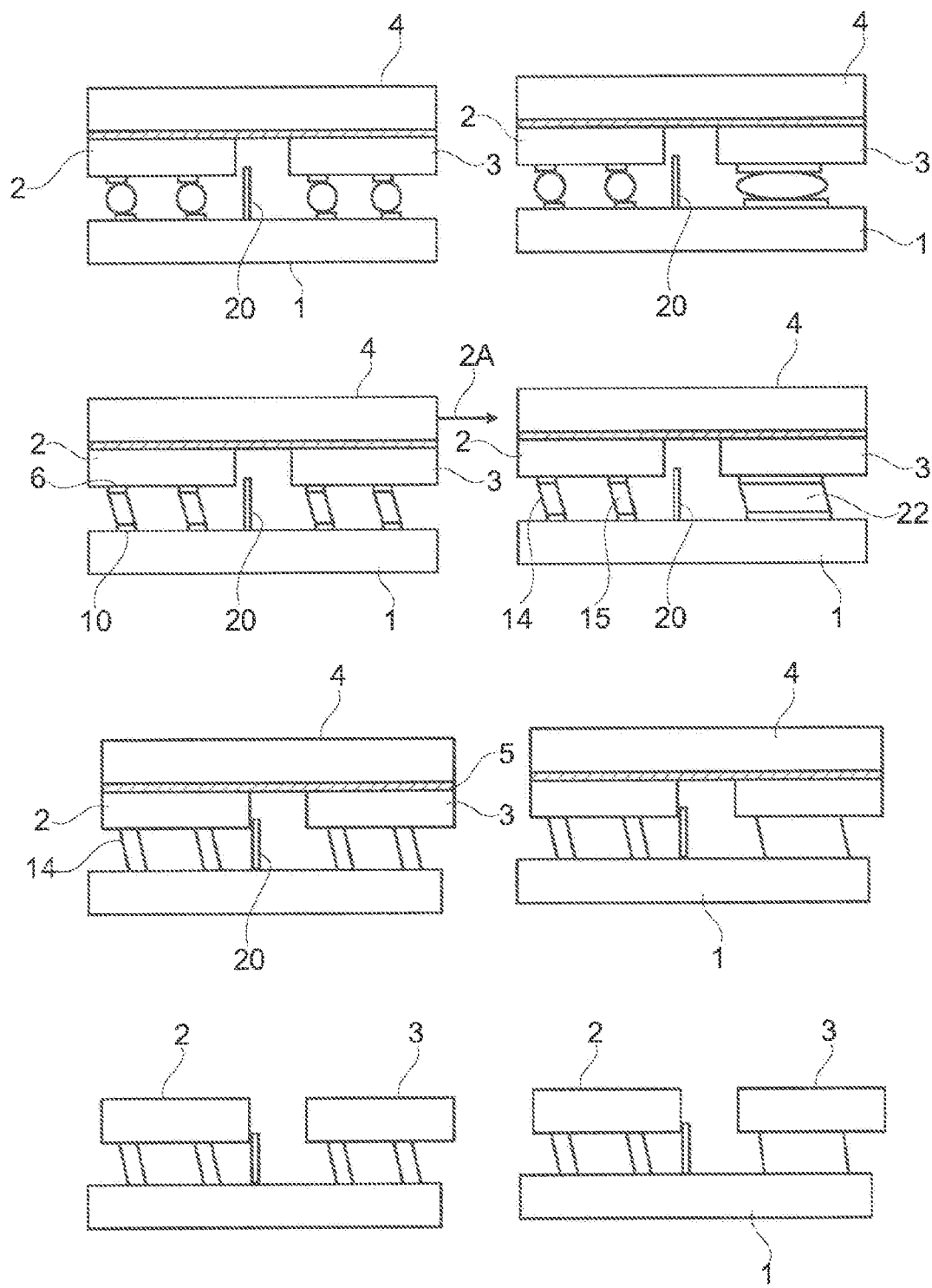
FIG. 3 illustrates four stages of the alignment of chips with respect to a substrate in the horizontal direction with separate stop elements on the substrate.
FIG. 4 illustrates four stages of the alignment corresponding to the stages from FIG. 3, a plurality of solder pads and solder joints of different sizes being provided here.

FIG. 1 shows a configuration with a substrate 1 on which chips 2, 3 are to be positioned, attached and contacted, and an intermediate carrier 4 and an adhesive layer 5. The chips 2, 3 are initially attached to the intermediate carrier 4 (conveyor) by means of the adhesive. In a previous step, the chips 2, 3, after being connected to the intermediate carrier 4, are separated from a common starting wafer in which they were manufactured. This process is described in more detail with reference to FIGS. 7-9. At the end of the process, the chips 2, 3 are positioned relative to one another on the intermediate carrier 4 as they were previously on the starting wafer.

The individual chips 2, 3 carry solder pads or metalizations 6, 7, 8, 9, each forming individual solder joints 6, 10, 7, 11, 8, 12, 9, 13 with opposite solder pads 10, 11, 12, 13 of the substrate 1 and a solder material 14, 15, 16, 17. In FIG. 1, the solder pads 6, 10 and 7, 11, 8, 12 and 9, 13 are each offset a bit from one another horizontally and parallel to the joining plane between the substrate and the intermediate carrier in the top representation of the configuration. A solder material is indicated symbolically in the form of balls 14, 15, 16, 17 between the individual pairs of solder pads. In fact, one would use electroplated and remelted solder, which sits on the pad as a spherical segment (cap). The solder material is normally initially deposited as a solder bump or solder supply either on a solder pad of the substrate or on a solder pad of a chip 2, 3 or on both.

During the soldering process, which typically takes place by reflow soldering, the solder material, which is initially present, for example, in the form of a deposited solder depot, is liquefied, so that the configuration is as shown in the second partial figure from the top of FIG. 1, where the solder pads 6, 10 are connected to one another by the liquefied solder material 14.

Due to the surface tension of the liquid solder material 14, forces act, tending to reduce the surface area of the liquid solder material. As a result, the intermediate carrier 4, together with the chips 2, 3 in FIG. 1, is displaced towards the substrate and to the right with respect to the substrate 1, so that the solder pads 6, 10 are brought closer together in pairs until a symmetrical configuration is obtained, as shown in the third partial figure from the top of FIG. 1. The solder material 14 forms a vertical column there between the solder pads 6, 10 (not shown in detail) of the chips 2, 3 and the substrate 1. A self-adjustment of the chips with respect to the substrate, which is known per se, thus takes place as a result of the reflow soldering. In a last step, the intermediate carrier 4 is then detached from the chips 2, 3 attached to the substrate 1, for which purpose the adhesive layer 5 can be destroyed or decomposed beforehand by the effect of electromagnetic radiation, for example, laser radiation. For this purpose, it can be provided that the intermediate carrier 4 is permeable to the radiation used and consists of a corresponding material. Alternatively or additionally, it can also be provided that the adhesive layer 5 is not continuous but consists of individual adhesive dots or adhesive patterns, so that the adhesive strength is limited and the intermediate carrier 4 can be detached from the substrate 1 without tearing off the chips 2, 3.

The configuration in which the chips 2, 3 are individually attached to the substrate 1 by the solder material and are contacted is shown in the bottom partial figure in FIG. 1.

In three representations, FIG. 2 shows different states during the positioning of chips 2, 3 with respect to a substrate 1, the positioning in the vertical direction between the chips and the substrate being the focus there. The uppermost of the three representations in FIG. 2 shows the chips 2, 3, fastened to the intermediate carrier 4, as a possible variant, fixed, vertical stops in the form of metal blocks 18, 19 being integrated into the soldering material 14, 16 at the soldering joints 6, 10, 14 and 8, 12, 16.

Said metal blocks 18, 19 are not melted during the soldering process, so that when the solder liquefies, which is shown in the second representation from the top in FIG. 2, the chips 2, 3 are drawn to the substrate 1 by the surface tension of the liquefied solder material until the solder pads 6, 10 have approached each other to the smallest possible distance, the stops 18, 19 being clamped between them. In this state, the solder material is then solidified again by cooling, so that the positioned configuration of the chips 2, 3 with the substrate 1 is stabilized in this state. The intermediate carrier 4 is then removed by destroying it or by removing the adhesive 5, so that, as shown in the lower representation of FIG. 2, only the chips 2, 3 remain, each individually attached to the substrate 1 by means of the solder connections. The distance between the chips 2, 3 and the substrate 1 is then given by the vertical stops/metal blocks 18, 19 integrated into the respective solder joints.

FIG. 3 shows a configuration with four partial representations, in which the chips 2, 3 are positioned horizontally with respect to the substrate 1, the surface tension forces of the solder being used during the soldering process and the exact end position being defined by separate stop bodies 20 attached to the substrate in the example shown. Corresponding stop bodies could just as well be attached to the chips 2, 3. The relative positioning of the substrate 1 to the chips 2, 3 takes place by striking an edge of a chip 2 against the stop body/stop element 20. In the second representation of FIG. 3, the liquefied solder material is shown between the respective solder pads of the solder joints, the liquefied solder exerting a force on the intermediate carrier 4 and the chips 2, 3, the force being indicated by the arrow 21 and by which the intermediate carrier with the chips is displaced to the right in the figure.

In the third representation of FIG. 3, the intermediate carrier with the chips has already been displaced horizontally to such an extent that the edge of the chip 2 has abutted against the stop body 20 and is in contact therewith. Even in this state, the solder joints are still shown such that the solder pads 6, 10 are not symmetrically opposite one another, so that the liquefied solder material 14 still tends to generate a positioning/displacement force in this state, ensuring that the chips and the intermediate carrier are held stably in the target position and pressed against the stop body 20. After the solder material 14 has solidified, the intermediate carrier 4 can then be removed with or without the adhesive layer 5, so that, as shown in the bottom representation of FIG. 3, the individual chips 2, 3 remain independently attached to the substrate and electrically contacted therewith. It is important to note here that not each of the chips 2, 3 strikes a stop element individually, but that a small number of stop elements 20 can be used to position one or fewer of the chips directly with respect to the substrate, a positioning of all the chips or chiplets in the target positions being indirectly achieved by the common attachment of the chips or also chiplets on the intermediate carrier 4.

FIG. 4 shows a configuration similar to that in FIG. 3, chips 2, 3 being aligned on the substrate 1 by means of lateral stops 20. The individual solder joints on the various chips 2, 3 are of different types, a solder joint having extraordinarily large solder pads on the right chip 3 being shown as an example. The result is that positioning forces of different strength are generated by the liquefied solder through the individual solder joints. With the same lateral offset of the solder pads, the positioning force is lower for a large solder joint 22 than for a plurality of small solder joints, which are represented by the solder material 14, 15 in the second representation from the top of FIG. 4. The solder joint 22 can also be designed such that it does not exert any resultant force on the intermediate carrier. Overall, the resultant force of the individual solder joints with liquefied solder material pulls the intermediate carrier with the chips 2, 3 into an end position which, according to FIG. 4, is given by a stop element 20 against which the chip 2 strikes. The right edge of the chip 2 thus forms a stop element on the side of the intermediate carrier. After removal of the intermediate carrier 4, as shown in FIG. 3, the individual chips 2, 3 remain attached to the substrate 1 individually and in each case.

FIG. 5 shows the positioning of chips 2, 3 with respect a substrate 1 in three representations one below the other, a stop body 23 being provided for the vertical positioning of the chips on the substrate. In this example, unlike in FIG. 2, the stop body 23 is not integrated into the solder joints or solder bumps, but instead exists independently of the solder joints between the chip 2 and the substrate 1. Said stop body 23 is attached to the substrate 1 in the example shown, but could just as well be attached to the chip 2.

In the example shown, the surface of the chip 2 facing the substrate also forms a stop element.

In a further variant, spacer elements functioning as stop elements could also be provided both on a chip 2 and on the substrate, said spacer elements also being able to abut and rest against one another.

According to the second representation from the top of FIG. 5, as part of the liquefaction of the solder material 14, the chips 2, 3 with the intermediate carrier 1 are brought closer to the substrate by the surface tension forces of the solder material until the chip 2 abuts against the stop element 23 and is held in contact with the stop element by the surface tension. The solder material 14 is cooled and solidified in this state. The intermediate carrier 1 can then be lifted off or with the adhesive layer 5 so that the chips 2, 3 are each positioned independently of one another and remain connected to the substrate 1 and electrically contacted.

In four representations arranged one below the other, FIG. 6 shows a positioning of chips 2, 3 with respect to a substrate 1, a lateral stop body 20 being provided on the substrate, against which a chip 2 abuts as part of the effect of surface tension forces during the soldering process. The top representation of FIG. 6 shows the solder joints on the chip 3 with a solder supply that has not yet liquefied and is arranged between the pairs of solder pads. In the second representation from the top of FIG. 6, the solder material 19 is then liquefied, so that the intermediate carrier 1 with the chips 2, 3 is pulled by surface tension in the representation to the right in the direction of the arrow 21 parallel to the joining plane, until the chip 2 strikes the stop body 20, as shown in the third representation from the top of FIG. 6. In this position, the solder material 19 is cooled so that it solidifies and the chip 3 is positioned in the target position with respect to the substrate 1. The special feature of this configuration is that the chip 2 has no solder joints and is therefore not connected to the substrate by the solder material, but only serves to position the chip 3 on the substrate 1 by interacting with the stop element 20. Accordingly, after removal of the intermediate carrier 1, only the chip 3 remains attached to the substrate 1 and contacted therewith. The stop element 20 is used for positioning in the horizontal direction, as indicated by the arrows 21 in the figures, while further stop bodies can be used for positioning in the vertical direction perpendicular to the arrows 21. However, stop bodies or stop elements can also be provided, which can simultaneously serve as the stop in different directions and are shaped accordingly. Basically, effort can be saved by the fact that the number of stop bodies both for the vertical positioning, that is, perpendicular to the joining plane between the intermediate carrier or the chips and the substrate, and parallel to said joining plane is less than the number of separate chips or chiplets to be positioned, in particular less than half the number of chips or less than 10% of the number of chips. The adhesive 5, with which the intermediate carrier is connected to the individual chips 2, 3, is selected such that said adhesive is stable at the soldering temperature, so that the chips do not shift on the intermediate carrier/conveyor. The adhesive can then later be released by other means, such as embrittlement by exposure to electromagnetic radiation or simply by the application of force, particularly if the adhesive layer is not designed to be continuous.

As shown in the example in FIG. 4, the solder joints on individual chips or a plurality of solder joints on a chip can be designed differently, some of the solder joints being able to be designed to optimize adjustment forces, while other solder joints have, for example, large contact areas with large solder pads. to be used later for good adhesion of the chips to the substrate, for high current consumption or for good thermal contact for cooling. The metalization of the solder pads can, for example, be made of titanium, platinum or gold in a particularly favorable manner in order to enter into a particularly deep connection with the solder material, also forming a high surface tension. The solder depots, which can advantageously be deposited on the solder pads, can contain gold/tin alloys, for example. If no mechanical stop elements are provided for stopping in the horizontal direction, the adjustment is made by the soldering process and the acting surface tension such that the solder pads are arranged one above the other and symmetrically to one another in the state of equilibrium. In this case, the deposition of the corresponding metalizations to create the solder pads must take place in advance such that the solder pads assume the corresponding relative position to one another at the target position of the chips on the substrate. To accommodate the individual chips from the starting wafer to the intermediate carrier, the adhesive material can be structured or printed onto the intermediate carrier, for example. The chips can then be transferred from the starting wafer to the intermediate carrier and held there by the adhesive. The intermediate carrier can then also be divided into what are known as conveyor tiles, which each carry a plurality of semiconductor components and can be positioned individually with respect to the substrate in accordance with the method according to the present disclosure. The individual sections of the intermediate carrier can then also be removed from the chips separately from one another. For example, using the method described, large numbers of chips can be distributed equidistantly on a substrate surface, as is necessary for optical displays or screens in which large numbers of LED arrangements have to be uniformly distributed, fixed and contacted on the surface of a substrate.

Figure 7:
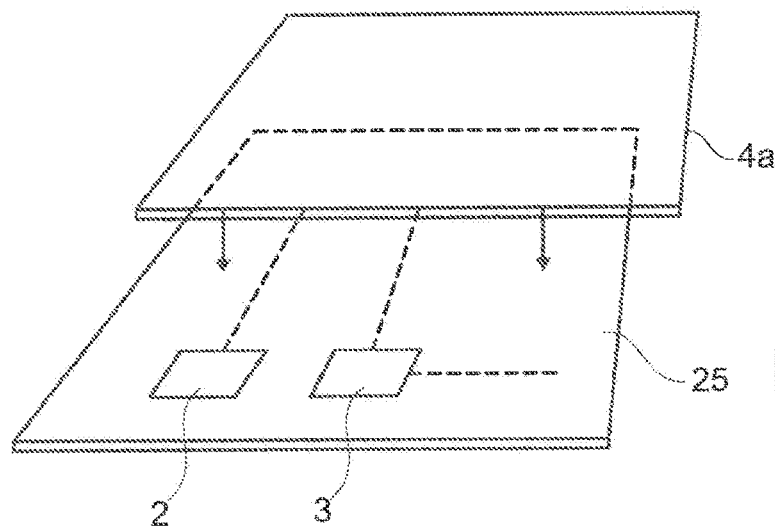
FIG. 7 illustrates a perspective view of a starting wafer having semiconductor components located thereon.

FIG. 7 shows a perspective view of a starting wafer 25 in or on which a plurality of semiconductor components 2, 3 have already been created by a method known per se. The semiconductor components are arranged in the starting wafer in the form of a one- or two-dimensional matrix with defined distances from one another.

FIG. 7 shows that a handling wafer 4a is placed on the starting wafer.

Figure 8:
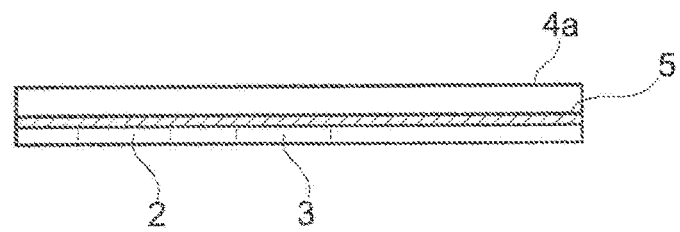
FIG. 8 illustrates a front view of a starting wafer with a handling wafer and an adhesive layer lying between them.

As shown in FIG. 8, an adhesive in the form of adhesive surface segments 5 is arranged between the wafers 4a, 25 such that the respective semiconductor components 2, 3 are connected to the handling wafer 4a by the adhesive.

Figure 9:
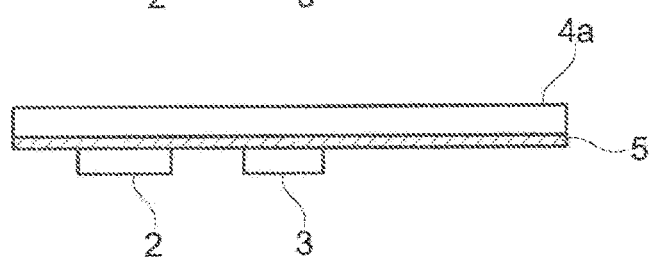
FIG. 9 illustrates semiconductor components adhering to a handling wafer.
Figure 10:
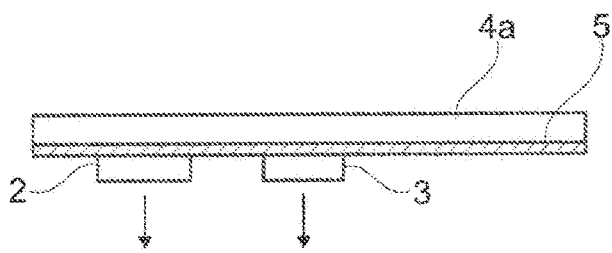
FIG. 10 illustrates the placing of a handling wafer from FIG. 9 on a further handling wafer.

In the next step, the starting wafer 25 is sawn up or divided by etching, so that the semiconductor components then individually adhere to the handling wafer, as shown in FIGS. 8 and 9. In a next step, the handling wafer 4a with the semiconductor components 2, 3 can be bonded to a further handling wafer 4b by means of a further adhesive layer 5a.

Figure 11:
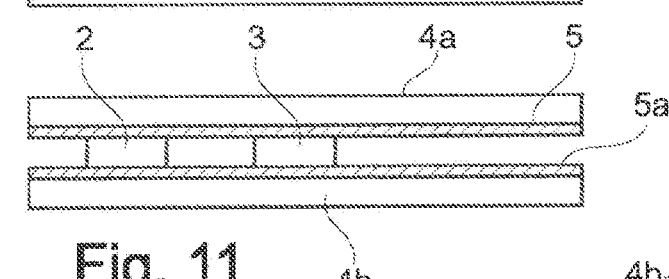
FIG. 11 illustrates the combination of the handling wafer, the semiconductor components and the further handling wafer.
Figure 12:
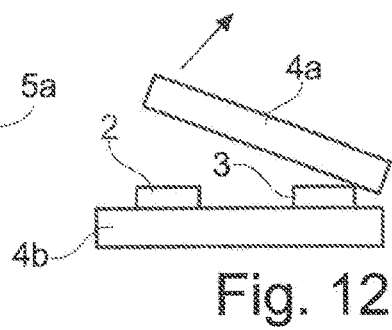
FIG. 12 illustrates the lifting of the handling wafer from the semiconductor components and the further handling wafer, so that the further handling wafer can now function as an intermediate carrier with semiconductor components adhering thereto.

Thereafter, the handling wafer 4a can be separated from the semiconductor components 2, 3, so that the components 2, 3 can now be connected to a substrate with their upper side that has become free, as shown in FIGS. 11 and 12. In this case, the components 2, 3 must have solder pads on their exposed upper sides for soldering to the substrate. It is important for the present disclosure that the relative positioning of the chips/semiconductor components to one another remains defined unchanged during the described process up to attachment to the substrate.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third,"

etc. are used merely as labels, and are not intended to impose numerical requirements on their objects.

What is claimed is:

1. A method for manufacturing a semiconductor arrangement, the arrangement including a substrate and one or more semiconductor components individually attached at one or more target positions on the substrate, wherein each of the semiconductor components include one or more solder pads, and wherein the substrate includes one or more solder pads, each being connected to the one or more solder pads of the semiconductor components via a solder material, the method comprising:

mechanically connecting one or more separate semiconductor components to a common intermediate carrier;

arranging the intermediate carrier with respect to the substrate so that, at least for a majority of the one or more semiconductor components, at least one solder pad of a particular semiconductor component lies opposite a solder pad of the substrate associated therewith, wherein the solder pad of the particular semiconductor component and the solder pad of the substrate associated therewith forms a solder joint; and connecting mutually associated solder pads of the one or more semiconductor components and the substrate by melting and solidifying a solder material arranged between the mutually associated solder pads, wherein the intermediate carrier is kept freely movable in one or more directions during a phase in which the solder material is liquid, so that a surface tension of the solder material between the mutually associated solder pads of the substrate and the one or more semiconductor components sets a predetermined position of the intermediate carrier relative to the substrate, in which the one or more semiconductor components assume a target position relative to the substrate.

2. The method according to claim 1, wherein the solder material is melted by a reflow soldering process.

3. The method according to claim 2, wherein the solder material is adhesively arranged on at least one of the solder pad of the substrate or on the one or more solder pads of the one or more semiconductor components.

4. The method according to claim 2, wherein the solder material is adhesively arranged partially on the solder pad of the substrate and partially on the one or more solder pads of the one or more semiconductor components.

5. The method according to claim 1, wherein at least two semiconductor elements are arranged next to one another on the intermediate carrier in at least one of a single plane or in two or more planes offset parallel to one another.

6. The method according to claim 5, wherein at least one of the single plane of the intermediate carrier or the two or more planes of the intermediate carrier are aligned parallel to one or more mutually offset planes of the substrate, wherein the intermediate carrier is initially held in one position relative to the substrate during a soldering process, wherein an adjustment force is generated at one or more of the solder joints, by the surface tension of the solder material, and wherein the adjustment force is directed parallel to at least one of: one or more of the planes of the substrate or one or more of the planes of the intermediate carrier.

7. The method according to claim 5, wherein the positioning of the intermediate carrier during a soldering process causes the intermediate carrier to be displaced parallel to at least one of the single plane or two or more planes of the intermediate carrier by one or more adjustment forces generated by the surface tension of the solder material, such that at least one lateral stop element of a second particular semiconductor component makes contact with a lateral stop element of the substrate.

8. The method according to claim 5, wherein during a soldering process, the intermediate carrier is brought close enough to the substrate so that at least one vertical stop element of the one or more semiconductor elements, wherein the vertical stop element limits a relative movement perpendicularly to at least one of the single plane or the two or more planes of the intermediate carrier, makes contact with one or more common vertical stop elements of the substrate.

9. The method according to claim 1, wherein after a soldering process, the intermediate carrier is separated from at least one of the one or more semiconductor components by at least one of using a laser or applying a force with or without acting on an adhesive connecting the one or more semiconductor components to the intermediate carrier.

10. The method according to claim 1, wherein after a soldering process, the intermediate carrier is separated from at least one of the one or more semiconductor components by an application of at least one of a laser or a force with or without acting on an adhesive connecting the semiconductor components to the intermediate carrier, and wherein the intermediate carrier together with the one or more semiconductor components, which form or include one or more mechanical stops for the target position of the intermediate carrier relative to the substrate, is removed from the substrate.

11. The method according to claim 1, wherein the one or more semiconductor components are first manufactured on a common starting wafer, wherein the starting wafer is then connected to a handling wafer such that each of the one or more semiconductor components is held on the handling wafer, wherein the one or more semiconductor components are then separated from one another, and wherein the handling wafer is then used as the intermediate carrier.

12. The method according to claim 11, wherein the one or more semiconductor components, are each connected to the handling wafer on a side.

13. The method according to claim 12, wherein the one or more semiconductor components are connected to a further handling wafer on a second side, wherein the connection to the handling wafer is severed and the further handling wafer then acts as the intermediate carrier.

14. An arrangement comprising:
an intermediate carrier;
one or more semiconductor components connected to the intermediate carrier, wherein the one or more semiconductor components include one or more solder pads; and
a substrate, the substrate including one or more solder pads;
wherein the one or more solder pads of the one or more semiconductor components are connected to the one or more solder pads of the substrate via a solder material; and
wherein one or more semiconductor components are arranged in a predetermined position of the intermediate carrier relative to the substrate, in which the one or more semiconductor components assume a target position relative to the substrate via a surface tension of the solder material between mutually associated solder pads of the substrate and the one or more semiconductor components during a phase in which the solder material is liquid and the intermediate carrier is kept freely movable in one or more directions.

15. The arrangement according to claim 14, wherein one or more mechanical stop elements are configured to position the intermediate carrier with the semiconductor components relative to the substrate.

16. The arrangement according to claim 15, wherein the one or more solder pads on the one or more semiconductor components, the one or more solder pads of the substrate, and the one or more mechanical stop elements are positioned such that when solder material arranged between opposite solder pads liquefies, at least one adjustment force is generated at least one solder joint due to a surface tension of the at least one solder joint, and wherein the at least one adjustment force holds the one or more mechanical stop elements of the one or more semiconductor components and the substrate against each other.

17. A semiconductor arrangement comprising:
an intermediate carrier;
a semiconductor component including one or more solder pads connected to the intermediate carrier;
a substrate including one or more solder pads connected to the one or more solder pads of the semiconductor component via a solder material; and
one or more mechanical stop elements configured to position the intermediate carrier and the semiconductor component relative to the substrate, wherein one or more semiconductor components are arranged in a predetermined position of the intermediate carrier relative to the substrate, in which the one or more semiconductor components assume a target position relative to the substrate via a surface tension of the solder material between mutually associated solder pads of the substrate and the one or more semiconductor components during a phase in which the solder material is liquid and the intermediate carrier is kept freely movable in one or more directions.

18. The semiconductor arrangement of claim 17, wherein the solder material is a reflow solder material.

19. The semiconductor arrangement of claim 17, further comprising:
a second semiconductor component located on the intermediate carrier, wherein the second semiconductor component is arranged adjacent to the semiconductor component in a plane.

20. The semiconductor arrangement of claim 19, wherein the plane is aligned parallel to a mutually offset plane of the substrate.

21. A method for manufacturing a semiconductor arrangement, the arrangement including a substrate and one or more semiconductor components individually attached at one or more target positions on the substrate, wherein each of the semiconductor components include one or more solder pads, and wherein the substrate includes one or more solder pads, each being connected to the one or more solder pads of the semiconductor components via a solder material, the method comprising:
mechanically connecting one or more separate semiconductor components to a common intermediate carrier;
arranging the intermediate carrier with respect to the substrate so that, at least for a majority of the one or more semiconductor components, at least one solder pad of a particular semiconductor component lies opposite a solder pad of the substrate associated therewith, wherein the solder pad of the particular semiconductor component and the solder pad of the substrate associated therewith forms a solder joint; and
connecting mutually associated solder pads of the one or more semiconductor components and the substrate by melting and solidifying a solder material arranged between the mutually associated solder pads, wherein the intermediate carrier is kept freely movable in one or more directions during a phase in which the solder material is liquid, so that a surface tension of the solder material between the mutually associated solder pads of the substrate and the one or more semiconductor components sets a predetermined position of the intermediate carrier relative to the substrate, in which the one or more semiconductor components assume a target position relative to the substrate; and
wherein the one or more semiconductor components are first manufactured on a common starting wafer, wherein the starting wafer is then connected to a handling wafer such that each of the one or more semiconductor components is held on the handling wafer, wherein the one or more semiconductor components are then separated from one another, and wherein the handling wafer is then used as the intermediate carrier.

* * * * *